US007003007B2

(12) United States Patent
Murata et al.

(10) Patent No.: US 7,003,007 B2
(45) Date of Patent: Feb. 21, 2006

(54) SYSTEM AND METHOD FOR USING AN OUTPUT TRANSFORMER FOR PACKAGED LASER DIODE DRIVERS

(75) Inventors: Kazuhiko Murata, Ageo (JP); Tatsuya Kouketsu, Akishima (JP); Yoshihiko Hayashi, Tokyo (JP)

(73) Assignee: Maxim Integrated Products, Inc., Sunnyvale, CA (US)

( * ) Notice: Subject to any disclaimer, the term of this patent is extended or adjusted under 35 U.S.C. 154(b) by 230 days.

(21) Appl. No.: 10/600,813

(22) Filed: Jun. 20, 2003

(65) Prior Publication Data

US 2004/0258115 A1    Dec. 23, 2004

(51) Int. Cl.
*H01S 3/13* (2006.01)
*H01S 3/00* (2006.01)

(52) U.S. Cl. .................... 372/38.02; 372/38.01
(58) Field of Classification Search .............. 372/38.02
See application file for complete search history.

(56) References Cited

U.S. PATENT DOCUMENTS

| 4,435,734 | A | * | 3/1984 | Hedberg et al. | ............ | 386/123 |
| 5,194,979 | A | * | 3/1993 | Koai et al. | ................... | 398/202 |
| 5,883,910 | A | | 3/1999 | Link | | |
| 6,421,362 | B1 | * | 7/2002 | Matsunaga | ............... | 372/38.02 |
| 6,667,661 | B1 | * | 12/2003 | Liu et al. | .................... | 330/311 |

OTHER PUBLICATIONS

"10.7Gbps EAM Driver", printed data sheet 19-4803; Rev 0; Maxim Integrated Products, Apr. 2001, pp. 1-12.

"3.0V to 5.5V, 1.25Gbps/2.5Gbps LAN Laser Drivers", printed data sheet 19-1550; Rev 2; Maxim Integrated Products, Mar. 2001, pp. 1-27.

"Simulating Direct Laser Modulation with the MAX3930", Design Note: HFDN-4.0, Rev 0; Maxim Integrated Products, Dec. 2000, pp. 1-3.

"Interfacing Maxim Lasers Drivers with Laser Diodes", Application Note: HFAN-2.0, Rev 0, Maxim Integrated Products, May 2000, pp. 1-14.

"Parasitic Inductance Effects in the Design of 10Gbps Optical Transmitters", Application Note: HFAN-2.0.1, Rev 0, Maxim Integrated Products, Feb. 2002, pp. 1-3.

"10.7Gbps Laser Diode Drivers", printed data sheet 19-1856; Rev 3, Maxim Integrated Products, Mar. 2002, pp. 1-14.

* cited by examiner

*Primary Examiner*—James Vannucci
(74) *Attorney, Agent, or Firm*—Jenkens & Gilchrist, P.C.

(57) ABSTRACT

A laser diode driver output stage for driving an associated laser diode device. In one aspect of the present invention, the laser diode driver output stage includes a driver circuit having at least one input node and an output node. The driver circuit is adapted to receive an input data signal at the at least one input node and provide an output signal at the output node in response to the data signal. The laser diode driver output stage further includes a transformer connected to the output node of the driver circuit. The transformer is adapted to receive the output signal at a first side and apply impedance compensation to the output signal to provide an output drive signal from a second side to drive the associated laser diode device.

13 Claims, 4 Drawing Sheets

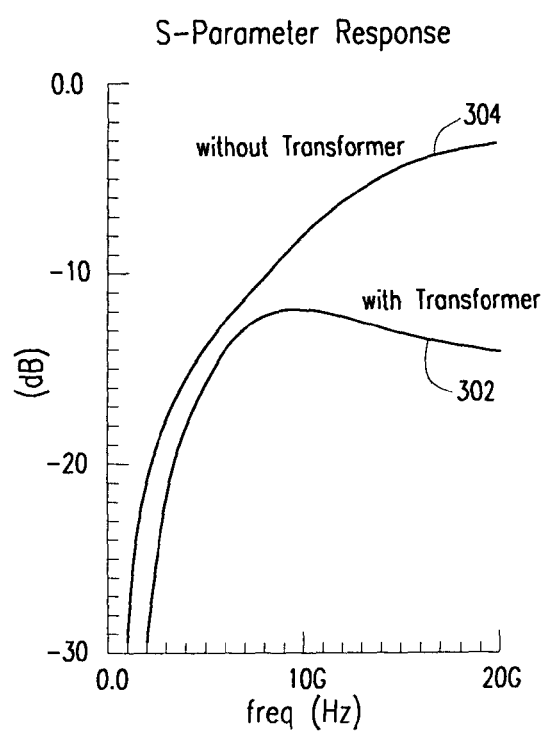
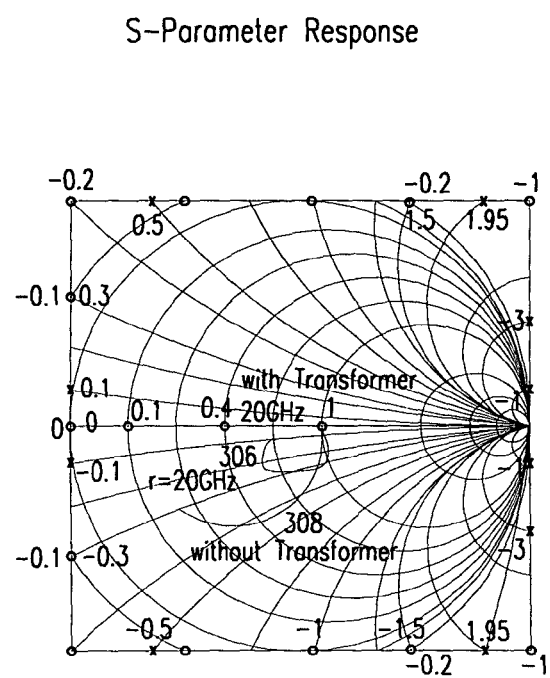
FIG. 3A
FIG. 3B

SYSTEM AND METHOD FOR USING AN OUTPUT TRANSFORMER FOR PACKAGED LASER DIODE DRIVERS

TECHNICAL FIELD OF THE INVENTION

The present invention relates to an improved laser diode driver integrated circuit, and in particular to a laser diode driver integrated circuit having an improved output stage.

BACKGROUND OF THE INVENTION

A majority of laser diode driver integrated circuits (ICs) for optical transmission can be broadly divided into two categories. The first category includes devices using direct modulation. This is generally used for short distance transmission in which a laser diode driver IC is used to directly drive a laser diode module with a drive current supplied by the laser diode driver IC. The second category includes devices which generally use external modulation. These are generally used for long-distance transmission in which, for example, an electroabsorption (EA) modulator driver IC is used to drive an electroabsorption (EA) modulator module. In both of these categories laser diode driver ICs can be found in both die forms in which the IC is assembled inside the laser module, and packaged forms in which the IC is assembled outside of the laser module and connected by a transmission line.

As a result of the operating frequencies of digital communication circuits, such as laser diode driver ICs, increasing beyond one gigahertz (GHz), lumped-element techniques for analyzing circuit behavior are no longer valid. As a result, scattering parameters, or S-parameters, have been developed for this purpose. S-parameters measurements become particularly important when the operating frequencies of laser diode driver integrated circuits are high enough that the size of circuit elements becomes a significant fraction, approximately one-tenth, of a wavelength of the transmitted signal. In addition, it is difficult to measure voltages and currents in order to obtain impedance measurements at frequencies in the microwave range.

In general, S-parameters are a measure of the ratio of reflected waves to incident waves delivered to a device to be measured. In particular, the S11 parameter, also referred to as the input return loss, is the measured ratio of the reflected wave from the device input to the incident wave on the device input. The S22 parameter, also referred to as the output return loss, is the measured ratio of the reflected wave from the device output to the incident wave on the device output. The S11 parameter can be related to the input impedance, and the S22 parameter can be related to the output impedance. Accordingly, S-parameters may be used to characterize the impedance properties of a device or transmission line.

Due to the need for ever increasing data transmission rates, the use of conventional laser diode driver integrated circuits results in numerous signal quality problems due to high frequency impedance effects. Thus there is a need for laser diode driver integrated circuits that provide improved output signal quality and reduced impedance mismatch at high frequencies of operation.

SUMMARY OF THE INVENTION

One embodiment of the present invention is directed to a laser diode driver output stage for driving an associated laser diode device. The laser diode driver output stage includes a driver circuit having at least one input node and an output node. The driver circuit is adapted to receive an input data signal at the at least one input node and provide an output signal at the output node in response to the data signal. The laser diode driver output stage further includes a transformer connected to the output node of the driver circuit. The transformer is adapted to receive the output signal at a first side and apply impedance compensation to the output signal so as to provide an output drive signal from a second side to drive the associated laser diode device.

Another embodiment of the present invention is directed to a method for providing an improved drive signal from a laser diode driver output stage to a laser diode device. The method includes the steps of receiving an input data signal at a driver circuit, providing an output signal from the driver circuit in response to the data signal, and receiving the output signal at an input to a first side of a transformer. The method further includes the steps of applying impedance compensation to the output signal to provide an output drive signal from an output of a second side of the transformer to drive the laser diode device.

BRIEF DESCRIPTION OF THE DRAWINGS

A more complete understanding of the method and apparatus of the present invention may be obtained by reference to the following Detailed Description when taken in conjunction with the accompanying Drawings wherein:

FIGS. 3A & 3B illustrate a comparison of an S-parameter response of a conventional laser diode driver integrated circuit and a laser diode driver integrated circuit (IC) constructed in accordance with the principles of the present invention.

DETAILED DESCRIPTION OF THE INVENTION

Figure 1:
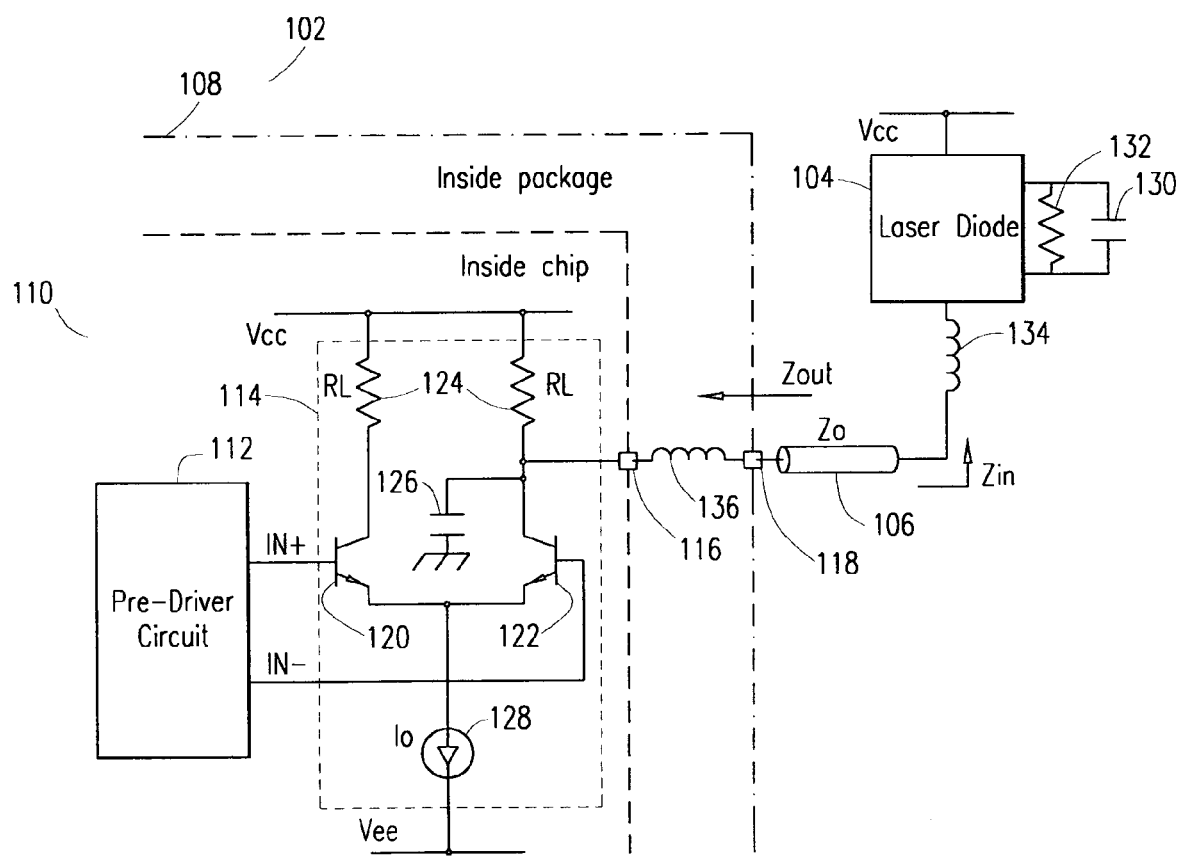
FIG. 1 illustrates an output stage of a conventional packaged laser diode driver integrated circuit (IC) and associated laser diode module.

Reference is now made to the Drawings wherein like reference characters denote like or similar parts throughout the various Figures. Referring now to FIG. 1, an output stage of a conventional packaged laser diode driver integrated circuit (IC) and associated laser diode module is illustrated. The conventional packaged laser diode driver IC 102 is connected to a laser diode module 104 through a transmission line 106. The transmission line 106 typically consists of a microstrip line placed upon a printed circuit board. The conventional packaged laser diode driver IC 102 is comprised of an integrated circuit package 108 having a conventional laser diode driver integrated circuit output stage 110 therein.

The conventional laser diode driver integrated circuit output stage 110 includes a pre-driver circuit 112 and a conventional driver circuit 114. During operation, the pre-driver circuit 112 provides differential input data signals (IN+,IN−), representative of the data signal that is desired to be transmitted by the laser diode module 104, to the conventional driver circuit 114. In response to the differential input data signals (IN+,IN−), the conventional driver circuit 114 provides a modulated output drive signal to an integrated circuit output pad 116. The integrated circuit output pad 116 is connected to a package output pin 118 to provide the modulated output drive signal from the conventional driver circuit 114 to the exterior of integrated circuit package 108.

Further, the package output pin 118 is connected to the transmission line 106 in order to provide the modulated output drive signal to the laser diode module 104. In response to the modulated output drive signal, the laser diode module 104 generates an optical output data signal that is representative of the differential input data signals (IN+,IN−).

The conventional driver circuit 114 of the conventional laser diode driver integrated circuit output stage 110 typically comprises an output switch architecture in the form of a bipolar junction transistor (BJT) differential pair configuration. The conventional driver circuit 114 of FIG. 1 includes a first transistor 120 and second transistor 122 whose respective emitter nodes are joined together and biased by a current source 128 having a current Io. The current source 128 is further connected to a low reference supply voltage (Vee). Each of the respective collector nodes of the first transistor 120 and second transistor 122 is connected to a high reference supply voltage (Vcc) through a termination resistor 124.

During operation, the aforementioned differential input data signals (IN+,IN−) are provided from the pre-driver circuit 112 to the respective gate nodes of the first transistor 120 and the second transistor 122. In addition, the current source 128 is typically modulated in synchronization with the voltage waveform of the input data signal. In response to the differential input data signals (IN+,IN−), the BJT differential pair configuration acting as a differential amplifier provides the modulated output drive signal from the collector node of the second transistor 122 to the integrated circuit output pad 116.

The output pad 116 is connected to the package output pin 118 through a connection having a package inductance 136, comprised of the sum of the wire bond inductance and the package lead inductance. The package output pin 118 is further connected to a cathode terminal of the laser diode module 104 through a transmission line 106, while the anode terminal of the laser diode module 104 is connected to the high reference supply voltage (Vcc).

The conventional packaged laser diode driver IC 102 described in FIG. 1 suffers from several disadvantages. The current of the output drive signal is typically required to be at a high level, on the order of several tens of milliamps (mA), to properly drive the laser diode module 104. Additionally, in order to achieve high data transfer rates, such as 10 Gbps or more, the rising time and falling time (tr/tf) of the waveform transitions of the modulated output drive signal should be on the order of several tens of picoseconds (ps). The second transistor 122 possesses an inherent parasitic capacitance 126 associated with the collector node due to the capacitance of the semiconductor junction between the base and collector of the second transistor 122. Due to the high drive current requirements of the laser diode module 104, the inherent parasitic capacitance 126 associated with the collector node of the second transistor 122 can reach hundreds or even thousands of femtofarads (fF). Typically, the termination resistor 124 is matched with the characteristic impedance (Z0) of the transmission line 106. However, due to the parasitic capacitance 126 of the second transistor 122, the integrated circuit output impedance (Zout) looking into the package output pin 118 from outside of the integrated circuit package 108 is capacitive and degrades at high frequency resulting in impedance mismatch.

The laser diode module 104 typically possesses a parasitic capacitance 130 of several picofarads (pF), as well as a resistance 132 and a cathode inductance 134. The parasitic capacitance 130 causes the input impedance (Zin) of the laser diode module 104 to also be capacitive and degrade at high frequencies. If the signal propagation time of the transmission line 106 connecting the conventional packaged laser diode driver IC 102 and the laser diode module 104 is shorter than the rising time and falling time (tr/tf) of the transitions of the output signal, the output return loss (S22) of the conventional packaged laser diode driver 102, and input return loss (S11) of the laser diode module 104, will not substantially affect the drive waveform of the laser diode module 104. However, in realistic module assembly conditions the propagation time of the transmission line 106 is over several picoseconds (ps), causing multiple reflections in the transmission waveform due to impedance discontinuities. Such impedance discontinuities result in overshoot/undershoot problems with the laser diode module drive signal waveform, which can be seen as small eye opening in an eye diagram, and an increase in deterministic jitter.

Figure 2:
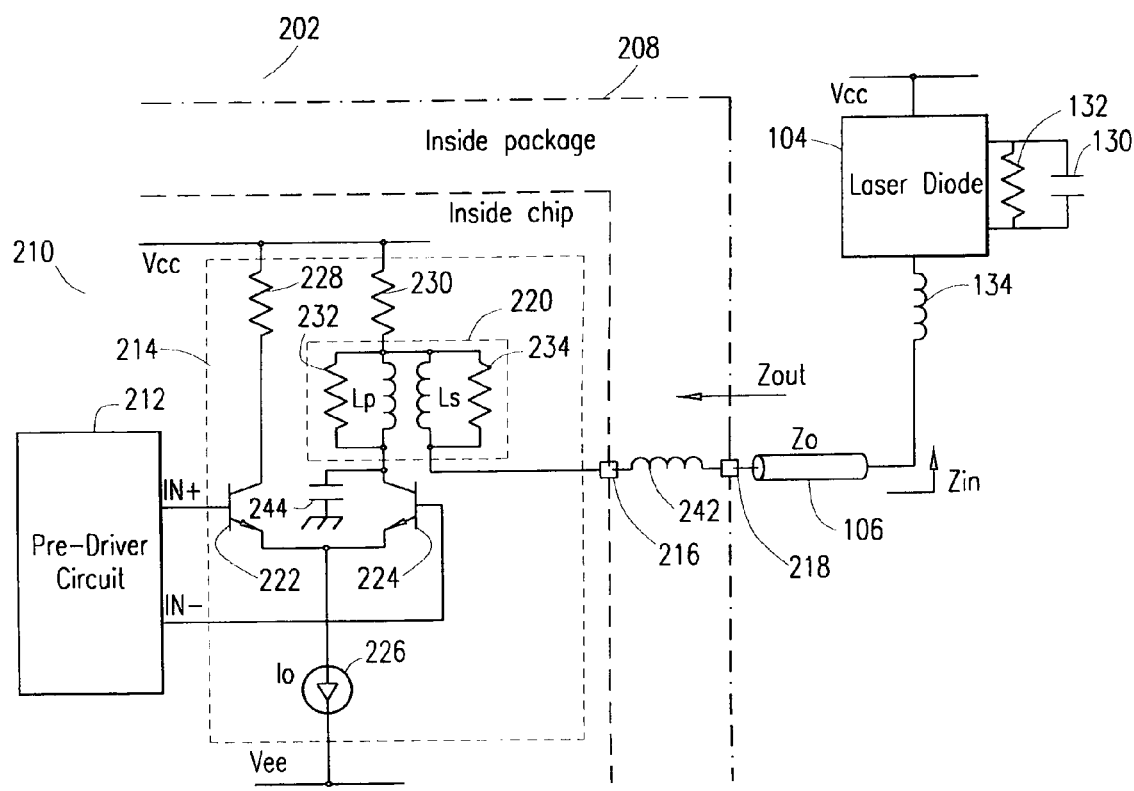
FIG. 2 illustrates an output stage of a laser diode driver integrated circuit (IC) in accordance with an embodiment of the present invention and an associated laser diode module.

Referring now to FIG. 2, an output stage of a laser diode driver integrated circuit (IC) in accordance with an embodiment of the present invention and an associated laser diode module is illustrated. The packaged laser diode driver IC 202 is connected to a laser diode module 104 using a transmission line 106. The packaged laser diode driver IC 202 is comprised of an integrated circuit package 208 having a laser diode driver integrated circuit (IC) output stage 210 therein.

The laser diode driver integrated circuit output stage 210 includes a pre-driver circuit 212 and a driver circuit 214 comprised of an output switch architecture. During operation, the pre-driver circuit 212 provides differential input data signals (IN+,IN−) to the driver circuit 214. In the presently described embodiment, the driver circuit 214 of the laser diode driver integrated circuit output stage 210 is comprised of a bipolar junction transistor (BJT) differential pair configuration. The driver circuit 214 of FIG. 2 includes a first switch transistor 222 and a second switch transistor 224 whose respective emitter nodes are joined together and biased by a current source 226 having a current Io. The current source 226 is further connected to a low reference supply voltage (Vee). In addition, the collector node of the first switch transistor 222 is connected to a high reference supply voltage (Vcc) through a first termination resistor 228.

In accordance with the present invention, a transformer 220 is connected between an output node of the driver circuit 214 and an integrated circuit output pad 216 of the laser diode driver integrated circuit output stage 210. It should be understood that the transformer 220 may be comprised of an on-chip transformer fabricated on the die of the laser diode driver integrated circuit output stage 210. Alternately, the transformer 220 may be comprised of any other suitable transformer either external to or internal to the integrated circuit package 208.

Still referring to FIG. 2, a negative terminal of a primary side (Lp) of the transformer 220 is connected to the collector node of the second switch transistor 224, and a positive terminal of the primary side (Lp) of the transformer 220 is connected to the high reference supply voltage (Vcc) through a second termination resistor 230. A positive terminal of a secondary side (Ls) of the transformer 220 is connected to the high reference supply voltage (Vcc) through the second termination transistor 230, and a negative terminal of the secondary side (Ls) of the transformer 220 is connected to the integrated circuit output pad 216.

Further, a primary side resistor 232 is connected in parallel between the positive and negative terminals of the primary side (Lp) of the transformer 220, and a secondary side resistor 234 is connected in parallel between the positive and negative terminals of the secondary side (Ls) of the transformer 220.

During operation, the differential input data signals (IN+, IN−) are provided from the pre-driver circuit 212 to the respective gate nodes of the first switch transistor 222 and the second switch transistor 224. In response to the differential input data signals (IN+,IN−), the differential pair configuration acting as a differential amplifier provides an output signal from the collector node of the second switch transistor 224 to the primary side (Lp) of transformer 220. In response to the output signal, an output drive signal is provided from the secondary side (Ls) of the transformer 220 to the integrated circuit output pad 216. The integrated circuit output pad 216 is connected to a package output pin 218 through a connection having an inductance 242. The package output pin 218 is in turn connected to a cathode terminal of the laser diode module 104 through a transmission line 106 having an impedance Zo, while the anode terminal of the laser diode module 104 is connected to the high reference supply voltage (Vcc). In addition, the laser diode module 104 possesses a parasitic capacitance 130, as well as a resistance 132 and a cathode inductance 134.

The inclusion of the transformer 220 in the laser diode driver IC output stage 210 as described in accordance with the principles of the present invention overcomes several disadvantages of conventional laser diode driver integrated circuits and provides an improved output drive signal. At low frequencies of data transmission from the laser diode driver integrated circuit 202, the output return loss (S22) of the output impedance (Zout) looking into the output pin 218 from outside of the integrated circuit package 208 is substantially determined by the value of the second termination resistor 230. For example, if the second termination resistor has a value of 50 ohms, the output impedance (Zout) will be substantially equal to 50 ohms at low frequencies.

At high frequencies of data transmission, the inductance of the primary side (Lp) of the transformer 220 compensates for the parasitic capacitance 244 of the collector node of the second switch transistor 224 that arises from the capacitance of the semiconductor junction between the base and collector. This compensation occurs because the capacitance effects on the output signal due to the parasitic capacitance 244 of the second switch transistor 224 are suppressed by the inductance of the primary side (Lp). At still higher frequencies, the primary side resistor 232, placed in parallel to the primary side (Lp) of the transformer 220, functions to repress the component of the output impedance (Zout) caused by the primary side (Lp) of the transformer 220. The secondary side (Ls) of the transformer 220 and secondary side resistor 234, placed between the second termination resistor 230 and the integrated circuit output pad 216, compensates for the impedance component due to the second termination resistor 230 looking from the Zout side.

Accordingly, the transformer 220 functions to improve the output return loss (S22) of the output impedance (Zout), as well as reduce multiple reflections of the transmission waveform of the output drive signal due to impedance discontinuities. An additional advantage of the present invention is that the output drive current and/or output drive voltage, rising time and falling time (tr/tf) of the output drive signal, and the output return loss (S22), can be optimized through the choice of appropriate values of the primary side resistor 232 and the secondary side resistor 234.

It should be understood that numerous modifications may be made to the embodiment of FIG. 2 without departing from the spirit of the present invention. Although the invention of FIG. 2 is illustrated using a bipolar junction transistor (BJT) pair architecture as a driver circuit, any other suitable output switch architecture may be used, such as those using field effect transistors (FETs), CMOS devices, etc. In addition, although the driver circuit of FIG. 2 is illustrated through the use of a single stage emitter-coupled differential amplifier, a cascaded configuration or other multi-stage differential amplifiers having a transformer in their output stages may be used without departing from the spirit of the invention. The principles of the present invention are also applicable to output stages having both single-ended and differential outputs and/or inputs, as well as laser diode driver output stages which include a bias current source to provide bias current to a connect laser diode module.

Although the embodiment of FIG. 2 illustrates the use of a laser diode driver IC to drive a laser diode module, the principles of the present invention are equally applicable to an electroabsorption (EA) modulator driver IC used to drive an electroabsorption (EA) modulator module for long distance transmission.

Referring now to FIGS. 3A & 3B, a comparison of an S-parameter response of a conventional laser diode driver integrated circuit (IC) without a transformer in its output stage, and a laser diode driver integrated circuit (IC) with a transformer in its output stage in accordance with the principles of the present invention is illustrated. In particular, FIG. 3A illustrates a magnitude plot of output return loss (S22) in decibels (dB) over a frequency range from 0 to 20 GHz. As illustrated in FIG. 3A, the magnitude of the output return loss (S22) of a laser diode driver IC having a transformer within its output stage 302 is significantly improved over the magnitude of the output return loss (S22) of a conventional laser diode driver IC lacking a transformer within its output stage 304. In particular, a significant improvement can be seen at frequencies above 10 GHz.

FIG. 3B illustrates in Smith chart form the output return loss (S22) of a laser diode driver IC in accordance with the principles of the present invention in comparison to the output return loss (S22) of a conventional laser diode driver IC. As is known in the art, a Smith chart provides for a graphical mapping of the complex impedance plane to the reflection coefficient plane. It is often useful to plot s-parameters, such as the output return loss (S22), using a Smith chart in order to illustrate the impedance properties of an electronic circuit over a range of frequencies.

FIG. 3B illustrates a Smith chart plot of the output return loss (S22) of a laser diode driver IC having a transformer within its output stage 306 in accordance with the principles of the present invention in comparison to a Smith chart plot of the output return loss of a conventional laser diode driver IC lacking a transformer within its output stage over a frequency range of 0 to 20 GHz. As illustrated in FIG. 3B, the output return loss (S22) of of a laser diode driver IC having a transformer within its output stage 306 is significantly improved over the output return loss (S22) of a conventional laser diode driver IC lacking a transformer within the output stage 308, in particular at higher frequencies.

Figure 4A:
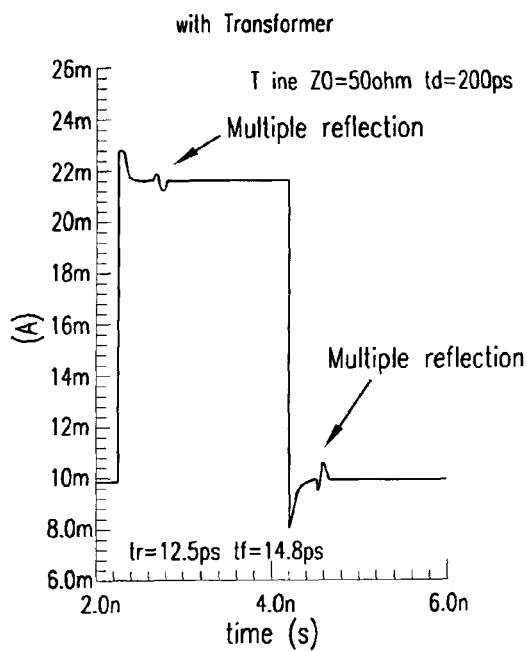
FIGS. 4A & 4B illustrate a comparison of the output current pulse response of a laser diode driver integrated circuit (IC) in accordance with the principles of the present invention and a conventional laser diode driver integrated circuit (IC).
Figure 4B:
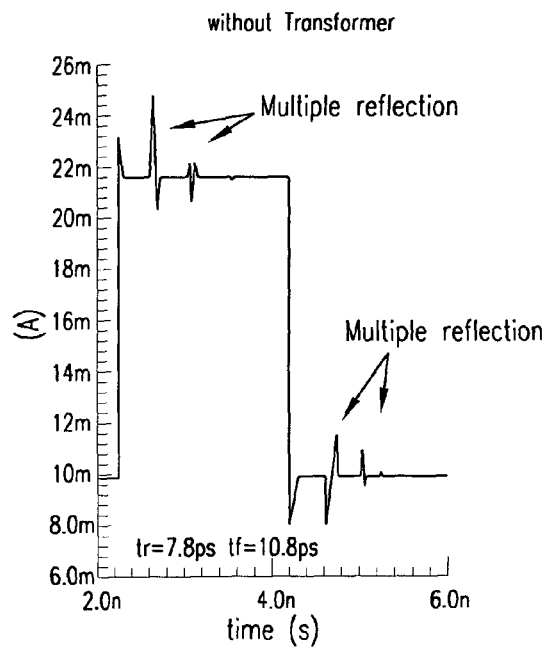

Referring now to FIGS. 4A & 4B, a comparison of the output current pulse response of a laser diode driver integrated circuit (IC) with a transformer in its output stage in accordance with the principles of the present invention, and a conventional laser diode driver integrated circuit (IC) without a transformer in its output stage is illustrated. FIG. 4A illustrates the amplitude of an output current pulse of a laser diode driver IC having a transformer in its output stage looking at the laser diode module through a transmission line of an electrical length of 200 picoseconds (ps). FIG. 4B illustrates the amplitude of an output current pulse of a conventional laser diode driver IC looking at the laser diode module through a transmission line of an electrical length of 200 picoseconds (ps). As can be observed, the multiple reflections present on the output current pulse of the laser diode driver having a transformer in its output stage (FIG. 4A) are significantly reduced in both number and amplitude over those of a conventional laser diode driver IC (FIG. 4B).

Although a preferred embodiment of the method and apparatus of the present invention has been illustrated in the accompanying Drawings and described in the foregoing Detailed Description, it should be understood that the invention is not limited to the embodiment disclosed, but is capable of numerous rearrangements, modifications, and substitutions without departing from the spirit of the invention as set forth and defined by the following claims.

What is claimed is:

1. A laser diode driver output stage for driving an associated laser diode device, the laser diode driver output stage comprising:
   a driver circuit having at least one input node and an output node, the driver circuit adapted to receive an input data signal at the at least one input node and provide an output signal at the output node in response to the data signal;
   a transformer coupled to the output node of the driver circuit, the transformer adapted to receive the output signal at a first side of the transformer and apply impedance compensation to the output signal to provide an output drive signal from a second side of the transformer, whereby the output drive signal is used to drive the associated laser diode device, the first side of the transformer further comprises a primary side and the second side of the transformer further comprises a secondary side, a negative terminal of the primary side of the transformer is adapted to receive the output signal from the drive circuit, a negative terminal of the secondary side of the transformer is adapted to provide the output drive signal, said primary side of the transformer is adapted to compensate for a parasitic capacitance associated with the driver circuit at a first frequency of operation;
   a primary side resistor coupled in parallel with the primary side of the transformer, the primary side resistor is adapted to repress an output impedance associated with the primary side of the transformer at a second frequency of operation higher than the first frequency of operation; and
   a termination resistor connected to a positive terminal of the primary side of the transformer, wherein the output impedance of the laser diode driver output stage is substantially equal to the impedance of the termination resistor at a third frequency of operation lower than the first frequency of operation.

2. The laser diode driver output stage of claim 1, further comprising:
   a secondary side resistor coupled in parallel with the secondary side of the transformer, the secondary side resistor and the secondary side of the transformer adapted to compensate for the impedance of the termination resistor at the third frequency of operation.

3. The laser diode driver output stage of claim 1, wherein the driver circuit further comprises an output switch architecture.

4. The laser diode driver output stage of claim 1, wherein the driver circuit comprises a differential amplifier.

5. The laser diode driver output stage of claim 1, wherein the driver circuit comprises:
   a first switch transistor adapted to receive a first differential input data signal of the input data signal at a first gate node; and
   a second switch transistor adapted to receive a second differential input data signal of the input data signal at a second gate node,
   wherein a first emitter node of the first switch transistor is connected to a second emitter node of the second switch transistor, and a first collector node of the second switch transistor is adapted to provide the output signal to the first side of the transformer.

6. The laser diode driver output stage of claim 5, wherein the first switch transistor comprises a first bipolar junction transistor, and the second switch transistor comprises a second bipolar junction transistor.

7. The laser diode driver output stage of claim 5, further comprising a current generator coupled to the first emitter node and the second emitter node.

8. The laser diode driver circuit output stage of claim 5, wherein a negative terminal of the first side of the transformer is adapted to receive the output signal from the first collector node of the second switch transistor, and a negative terminal of the second side of the transformer is adapted to provide the output drive signal.

9. The laser diode driver output stage of claim 8, wherein the first side of the transformer is adapted to compensate for a parasitic capacitance associated with the first collector node of the second switch transistor at a first frequency of operation.

10. The laser diode driver output stage of claim 1, further comprising a pre-driver circuit adapted to provide the input data signal to the driver circuit.

11. A method for providing an improved drive signal from a laser diode driver output stage to a laser diode device, the method comprising the steps of:
    receiving an input data signal at a driver circuit;
    providing an output signal from the driver circuit in response to the data signal;
    receiving the output signal at an input to a first side of a transformer; and
    applying impedance compensation to the output signal to provide an output drive signal from an output of a second side of the transformer, whereby the output drive signal is used to drive the laser diode device;
    wherein the first side of the transformer comprises a primary side and the second side of the transformer comprises a secondary side, the step of applying impedance compensation further comprises compensating for a parasitic capacitance associated with the driver circuit at a first frequency of operation using the primary side of the transformer and comprises repressing an output impedance associated with the primary side of the transformer at a second frequency of operation higher than the first frequency of operation using a primary side resistor connected in parallel with the primary side of the transformer, and wherein the output impedance of the laser diode driver output stage at a third frequency of operation lower than the first frequency of operation is substantially equal to the impedance of a termination resistor coupled to a positive terminal of the primary side of the transformer.

12. The method of claim 11, wherein the step of applying impedance compensation to the output signal further comprises the step of compensating for the impedance of the termination resistor at the third frequency of operation using a secondary side resistor coupled in parallel with the secondary side of the transformer, and a secondary side of the transformer.

13. The method of claim 11, further comprising the step of providing the output drive signal to the laser diode device using a transmission line.

* * * * *